(12) United States Patent
Mizukawa et al.

(10) Patent No.: US 8,145,045 B2
(45) Date of Patent: Mar. 27, 2012

(54) FILAMENT LAMP AND LIGHT IRRADIATION HEAT TREATMENT DEVICE

(75) Inventors: Yoichi Mizukawa, Himeji (JP); Kenji Tanino, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 265 days.

(21) Appl. No.: 12/544,385

(22) Filed: Aug. 20, 2009

(65) Prior Publication Data

US 2010/0054719 A1   Mar. 4, 2010

(30) Foreign Application Priority Data

Aug. 26, 2008   (JP) ................................ 2008-216265

(51) Int. Cl.
  *F26B 3/30*   (2006.01)
(52) U.S. Cl. .......................... 392/411; 392/407; 392/497
(58) Field of Classification Search .................. None
  See application file for complete search history.

(56) References Cited

U.S. PATENT DOCUMENTS

| 2,864,025 | A | * | 12/1958 | Foote et al. .................... 313/279 |
| 3,483,609 | A |   | 12/1969 | Stone et al. |
| 4,598,194 | A | * | 7/1986 | Halberstadt et al. ........ 219/459.1 |
| 4,710,676 | A |   | 12/1987 | Morris et al. |
| 4,851,733 | A |   | 7/1989 | Kuus et al. |
| 5,008,592 | A |   | 4/1991 | Pragt |
| 5,157,758 | A | * | 10/1992 | Halberstadt et al. ........... 392/408 |
| 6,399,955 | B1 | * | 6/2002 | Fannon ...................... 250/504 R |
| 7,471,885 | B2 | * | 12/2008 | Mizukawa et al. ........... 392/407 |
| 7,873,265 | B2 | * | 1/2011 | Kitagawa et al. ............. 392/416 |
| 2006/0197454 | A1 |   | 9/2006 | Mizukawa et al. |
| 2008/0298787 | A1 | * | 12/2008 | Suzuki et al. .................. 392/411 |
| 2009/0153052 | A1 | * | 6/2009 | Braun et al. ................... 313/623 |

FOREIGN PATENT DOCUMENTS

| EP | 0 370 554 A1 | 5/1990 |
| EP | 1 976 337 A1 | 10/2008 |
| JP | 63-263719 A | 10/1988 |
| JP | 2000-306657 A | 11/2000 |
| JP | 2002-258646 A | 9/2002 |
| JP | 2005-32552 A | 2/2005 |
| JP | 2008-108504 A | 5/2008 |

OTHER PUBLICATIONS

European Search Report for Application No. EP 09 01 0678; Dated Nov. 3, 2010.

* cited by examiner

*Primary Examiner* — Thor Campbell
(74) *Attorney, Agent, or Firm* — Roberts Mlotkowski Safran & Cole, P.C; David S. Safran

(57) ABSTRACT

A filament lamp has a bulb comprised of a straight light emitting tube from which a pair of flat hermetically sealed portions extend, a plurality of coiled filaments arranged within the light emitting tube, in the tube axis direction a pair of internal leads are connected to ends of the filament by a respective one of a plurality of metal foils that are embedded in the hermetically sealed portions, and external leads are connected to the metal foils. The width of metal foils embedded in the hermetically sealed portions is increased so as not to cause them to melt even when an electric current to be supplied to the filament lamp is increased, the hermetically sealed portions being made wider than the external diameter of the light emitting tube and the width between outer margins of the metal foils in a direction at right angles of the tube axis is greater than the internal diameter of the light emitting tube.

2 Claims, 8 Drawing Sheets

FILAMENT LAMP AND LIGHT IRRADIATION HEAT TREATMENT DEVICE

BACKGROUND OF THE INVENTION

1. Field of Invention

The present invention relates to a filament lamp and light irradiation heat treatment device, and particularly relates to a filament lamp used for heating an article to be treated and a light irradiation heat treatment device using the filament lamp.

2. Description of Related Art

At present, heat treatment by light irradiation from a light source is used on the occasion of various processes in a semiconductor manufacturing process, for example, film formation, oxidization, nitriding, film stabilization, silicidation, crystallization and ion injection activation. Particularly, rapid thermal processing (RTP) for rapidly increasing or decreasing the temperature of an article to be treated, for example, a semiconductor wafer, is preferably used because it can improve the throughput and quality.

In such a light irradiation type heat treatment device (hereafter, simply referred to as "heat treatment device") for RTP, for example, a filament lamp is used as the light source.

In the filament lamp, filaments are arranged within a bulb made from a light transparent material, and 90% or greater of input power is radiated, and it is possible to heat the article W to be treated without any contact. Therefore, when the filament lamp is used as a heat source for heating a semiconductor wafer, it is possible to rapidly increase or decrease the temperature of the article to be treated compared to the resistance heating method, specifically, to increase the article to be treated, for example, to 1,000° C. or higher in several seconds to several tens of seconds; concurrently, after the light irradiation is stopped, the article to be treated can be rapidly cooled down.

One of the present inventors and his co-inventors have proposed a filament lamp having the configuration mentioned below to be used as a light source of such a light irradiation type heat treatment device (see, Japanese Unexamined Patent Application Publication 2006-279008 and corresponding U.S. Patent Application Publication 2006/0197454).

Explaining this filament lamp with reference to FIG. 8, coiled filaments 4, 5, 6 are sequentially aligned and arranged so as to extend in the tube axis direction of a bulb 1 within a straight light emitting tube whose both ends are hermetically sealed by hermetically sealed portions 2a, 2b, and internal leads 4a, 4b, 5a, 5b, 6a, 6b for electrical power supply are connected at both ends of the filaments 4, 5, 6, respectively. The internal leads of each filament extend toward both hermetically sealed portions, respectively, and are electrically connected to external leads via metal foils, individually. In other words, the internal leads 4a, 5a, 6a at one end of the filaments 4, 5, 6 are electrically connected to external leads 10a, 11a, 12a at one end via the metal foils 7a, 8a, 9a of hermetically sealed portion 2a at the respective end of the bulb 1. Similarly, internal leads 4b, 5b, 6b at the other ends are electrically connected to external leads 10b, 11b 12b via the metal foils 7b, 8b, 9b of the hermetically sealed portion 2b at the respective other end of the bulb 1. Then, the filaments 4, 5, 6 are individually connecting to feed devices 13, 14 15 via the external leads 10a, 10b, 11a, 11b, 12a, 12b, respectively.

Furthermore, an insulating tube 16 is fitted onto the internal leads 4b, 5a, 5b, 6a of the filaments 4, 5, 6, respectively, and it is placed on a section facing the filaments 4, 5, 6. Further, circular anchors 17 are arranged in parallel in the tube axis direction of the bulb 1 at positions between the inner wall of the bulb 1 and the insulating tubes 16. The filaments 4, 5, 6 are supported, for example, by two anchors, so as not to make contact with the bulb 1, respectively.

According to the heat treatment device using the filament lamp having such a configuration, since a plurality of filaments can be individually fed and luminescence of each filament can be individually controlled, even if the distribution of the degree of local temperature change, for example, on the article to be heat-treated is asymmetrical with regard to the shape of the article, light can be irradiated with the desired irradiance distribution according to the characteristic of the article to be treated, and as a result, the article to be treated can be uniformly heated; therefore, it is advantageous that uniform temperature distribution can be realized throughout the entire surface to be irradiated in the article to be treated.

For example, when RTP is conducted to a semiconductor wafer using a heat treatment device having such a filament lamp, since it becomes necessary to improve the rate of temperature increase of the article to be treated for the purpose of throughput improvement, it becomes necessary to increase the electric power to be supplied to the filament lamp more than ever before. In association with this, in the filament lamp for a heat treatment device, since it becomes necessary to apply a great electric current to the filaments, meltdown due to an excessively high temperature of the metal foils at the time of lighting the filaments has to be avoided. Consequently, it becomes necessary to widen the width of the metal foils in the direction at right angles of the tube axis of the bulb. Explaining based upon the example in FIG. 8, it becomes necessary to widen the width of the metal foils 7a, 7b, 8a, 8b, 9a, 9b in the direction at right angles of the tube axis of the bulb 1, respectively.

In order to embed the metal foils, which are wider than before, into the hermetically sealed portions, the width of the hermetically sealed portions have to be wider than before. Simply, it is believed that the width of the hermetically sealed portions can be widened by increasing the external diameter of the bulb. However, in the heat treatment device, since it is necessary to closely align and arrange many filament lamps with respect to the article to be treated in order to realize the highly accurate temperature uniformity of the article to be treated, a configuration with an increased external diameter of the bulb of the filament lamp cannot be adopted. Therefore, the conventional filament lamp shown in FIG. 8 has the problem that metal foils made wider than before cannot be arranged in the hermetically sealed portions.

As described above, in the filament lamps for the heat treatment device, the width of the metal foils to be arranged in the hermetically sealed portions needs to be wider than before while the external diameter of the bulb of the filament lamps needs to be the same level or smaller. Satisfaction of such contradictory requirements is difficult with the conventional filament lamp.

SUMMARY OF THE INVENTION

Based upon the above circumstances, the present invention has a primary object of improving the rate of temperature increase of an article to be treated by widening the width of the metal foils so as to eliminate the possibility of meltdown of the metal foils embedded in the hermetically sealed portions even if the electric current to be supplied to the filament lamps is increased.

Further, the object of the present invention is to enable to securely embed the metal foils in the hermetically sealed portions even if the external diameter of the bulb of the filament lamp remains the same or is reduced in order to realize a highly accurate temperature uniformity of the article to be treated.

The present invention is characterized by a filament lamp that comprises a bulb with a straight tube and a pair of flat hermetically sealed portions continuously formed at both ends of the bulb, and wherein a plurality of coiled filaments are sequentially aligned and arranged in the tube axis direction within the bulb, respectively; a pair of internal leads is connected to both ends of the filament, respectively; a plurality of metal foils are isolated from each other and embedded in the hermetically sealed portion, respectively; the internal leads are connected to the metal foils, respectively; and the external leads are connected to the metal foils, respectively, wherein the hermetically sealed portions are formed wider than the external diameter of the light emitting tube; and the width between the outermost margins of the two metal foils arranged at both ends, between two lines extending in parallel to the tube axis, in a direction at right angles of the tube axis of the bulb, is greater than the internal diameter of the light emitting tube.

In addition, the light irradiation type heat treatment device of the present invention is characterized by having a lamp unit with a plurality of filament lamps, where flat hermetically sealed portions are arranged in parallel so as to extend in parallel in a direction essentially vertical to an article to be treated, for irradiating light emitted from the lamp unit and heating the article to be treated.

DETAILED DESCRIPTION OF THE INVENTION

The filament lamp of the present invention is configured such that hermetically sealed portions are formed to be wider than the external diameter of the light emitting tube; concurrently, the width between the outermost margins of the metal foils placed at both ends in the direction at right angles of the tube axis of the bulb, between two lines extending in parallel to the tube axis of the bulb, is greater than the internal diameter of the light emitting tube. Therefore, even when individual metal foils are wider, in order to not to cause any meltdown at the time of operating the filament lamp, the same number of metal foils as the number of filaments can be arranged in each hermetically sealed portion.

In addition, according to the light irradiation type heat treatment device of the present invention, since each hermetically sealed portion is arranged so as to extend in parallel with each other substantially in a direction normal to the article to be treated, the distance between the adjacent bulbs in the filament lamp can be small and remains as small as possible. Therefore, according to the light irradiation type heat treatment device of the present invention, highly accurate temperature uniformity of the article to be treated can be realized.

Figure 1:
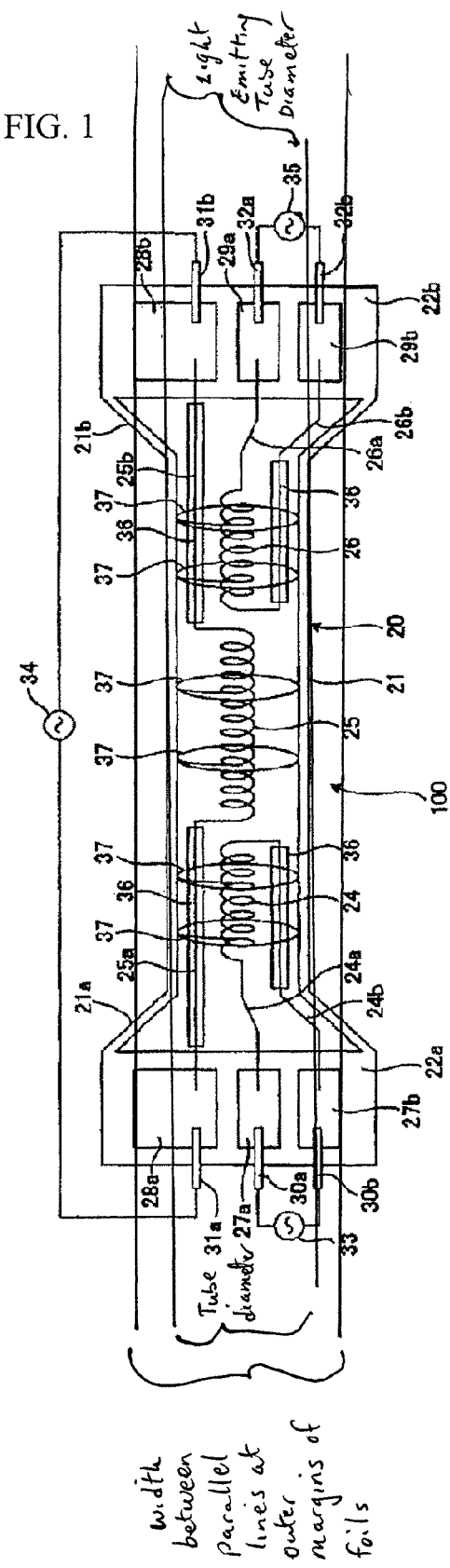
FIG. 1 is a front view showing the entire configuration of the filament lamp of the present invention.
Figure 2:
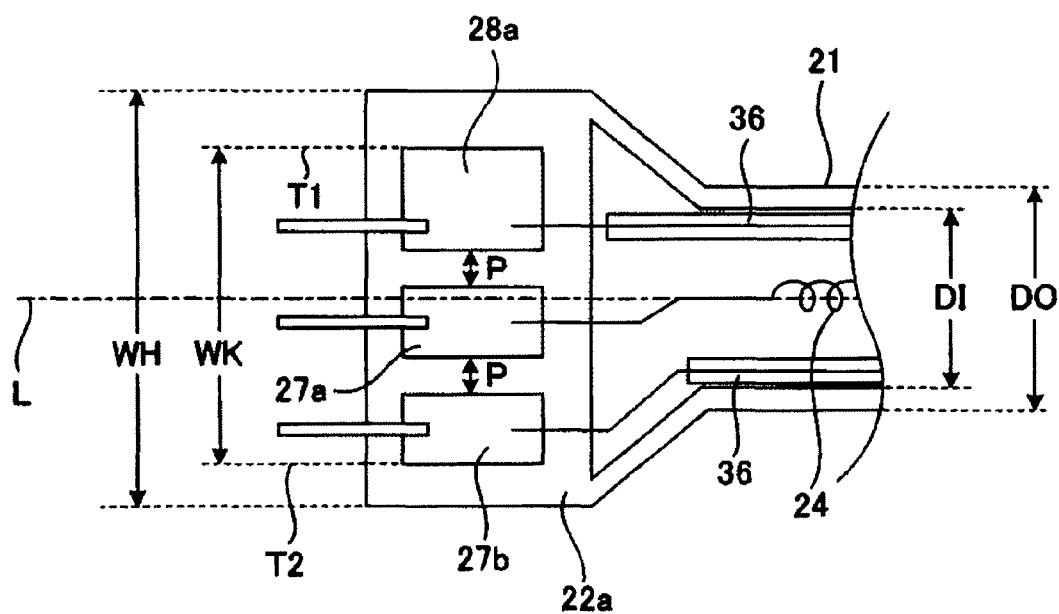
FIG. 2 is an enlarged view of main parts of the filament lamp in FIG. 1.

FIG. 1 shows the basic configuration of one example of the filament lamp of the present invention. FIG. 2 is an enlarged view of the main parts at one end of the filament lamp.

This filament lamp 100 is equipped with a straight bulb 20 composed of a straight light emitting tube 21 and hermetically sealed portions 22a, 22b extending from both ends of the light emitting tube 21. The bulb 20 is made of a light transparent material, such as silica glass, and halogen gas for conducting the halogen cycle and inert gas are encapsulated at predetermined pressures.

A plurality of coiled filaments 24, 25, 26 (three in the embodiment of FIG. 1) are sequentially aligned and arranged in parallel so as to extend along the tube axis of the bulb 20.

Slope parts 21a, 21b are formed at each end of the light emitting tube 21 so as to gradually expand the external diameter from that of light emitting tube 21 to that of the hermetically sealed portions 22a, 22b. Each of the hermetically sealed portions 22a, 22b is formed extending from a respective one of the slope parts 21a, 21b. The inside of each of the slope parts 21a, 21b is hollow.

Internal leads 24a, 24b of the filament 24 are arranged close to the hermetically sealed portion 22a at one end, extend from the hermetically sealed portion 22a and are connected to the ends of the filament 24, respectively. These internal leads 24a, 24b are retained in the same hermetically sealed portion 22a, and are connected to metal foils 27a, 27b, respectively.

The internal leads 25a, 25b of the filament 25 are arranged in the center, extend toward the hermetically sealed portions 22a, 22b, and are connected to metal foils 28a, 28b in the hermetically sealed portions, respectively.

At the other end, the internal leads 26a, 26b of the filament 26 are arranged close to the hermetically sealed portion 22b, extend from the hermetically sealed portion 22b, and are connected to the filament 26, respectively. These internal leads 26a, 26b are both retained in the same hermetically sealed portion 22b, and are connected to metal foils 29a, 29b, respectively.

External leads 30a, 30b, 31a, 31b, 32a, 32b are connected to the metal foils 27a, 27b, 28a, 28b, 29a, 29b, respectively. A feed device 33 is connected to the external leads 30a, 30b, a feed device 34 is connected to the external leads 31a, 31b, and a feed device 35 is connected to the external leads 32a, 32b. In the filament lamp of the present invention, electric power is individually supplied to the filaments 24 to 26 by the feed devices 33 to 35, respectively. The light intensity to be emitted from the filaments 24 to 26 is individually controlled.

An insulating tube 36 is established around each of the internal leads 24b, 25a, 25b, and 26b. The insulating tubes 36 are made from an insulating material, for example, silica glass. The insulating tubes 36 are placed within the light emitting tube 21 so as to have their external circumferential surfaces coming into contact with the inner wall of the light emitting tube 21, respectively. Thus, since the heat of the insulating tubes 36 is radiated at the time of lighting the filament lamp via the light emitting tube 21, it prevents the insulating tubes 36 from reaching a high temperature state.

Further, for each of the filaments 24, 25, 26, two circular anchors 37 are integrally established. The circular anchors 37 for the filaments 24, 26 are placed within the light emitting tube 21 so as to be at a position between the inner wall of the light emitting tube 21 and the insulating tube 36. The circular anchors 37 for the filament 25 are arranged to come into contact with the inner wall of the light emitting tube 21.

The filaments 24, 25, 26 are arranged on the tube axis of the light emitting tube 21 by the circular anchors 37; concurrently, they prevent the filaments 24, 25, 26 from hanging down in the direction of gravitational force. Therefore, because the filaments 24 to 26, which will be at high temperature at the time of lighting the filament lamp 100, will never make contact with the inner wall of the light emitting tube 21, devitrification of the light emitting tube 21 can be securely prevented.

A configuration example of the filament lamp 100 of the present invention is shown below.

The external diameter (DO in FIG. 2) of the light emitting tube 21 is 10 mm to 20 mm; the internal diameter (DI in FIG. 2) of the light emitting tube 21 is 8 mm to 17 mm; the width (WH in FIG. 2) of the hermetically sealed portions 22a, 22b is 12 mm to 22 mm, respectively; the width of the plurality of metal foils (WK in FIG. 2) embedded in the hermetically sealed portions is 9 mm to 18 mm, respectively; and the interval (P in FIG. 2) between adjacent metal foils is 1 mm or greater.

Further, numerical examples of maximum values of the rated current of the filament lamp 100 having the above specification are shown below.

Example 1

WK=9 mm
Width of metal foils 28a, 28b=3 mm
Width of metal foils 27a, 27b, 29a, 29b=2 mm
Interval of adjacent metal foils P=1 mm
Maximum rated current of filament 25=12 A
Maximum rated current of filament 24, 26=10 A Example 2

WK=18 mm
Width of metal foils 28a, 28b=6 mm
Width of metal foils 27a, 27b, 29a, 29b=5 mm
Interval of adjacent metal foils P=1 mm
Maximum rated current of filament 25=20 A
Maximum rated current of filaments 24, 26=16 A Thus, since the filament lamp of the present invention improves the rate of temperature increase of an article to be treated, a great current, 10 A to 20 A at maximum, is applied to each filament. Therefore, the metal foils 27a, 27b, 28a, 28b, 29a, 29b are formed to be rather wide so as not to cause meltdown at the time of lighting the filament lamp.

Further, since this type of filament lamp accurately controls the temperature of the article to be treated, it is preferable to arrange many (at least three) filaments within the light emitting tube 21. In other words, it is assumed that many and wider metal foils are arranged in each hermetically sealed portion; however, as described above, the external diameter of the luminous 21 cannot be increased. Therefore, while the external diameter of the bulb is maintained to be the same as in a conventional bulb, it is important that the width of the hermetically sealed portion 22a is relatively greater than the external diameter of the light emitting tube 21.

A method for manufacturing the bulb for responding to this demand is explained using FIG. 3 which is a diagram showing a method for manufacturing a bulb of the filament lamp of the present invention. The bulb is manufactured by melting and connecting a plurality of glass tubes of different external diameters.

(First Step)

Figure 3A:
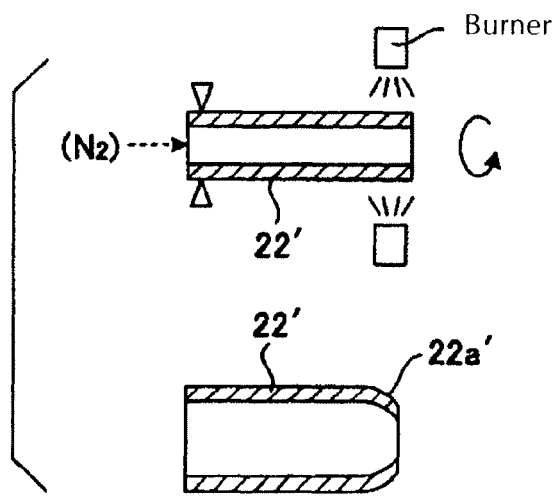
FIG. 3(A)-3(C) are diagrams for use in explaining the method for manufacturing a bulb.

FIG. 3(A) shows a procedure for manufacturing the first glass tube. Inert gas, such as nitrogen gas, is introduced into an opening at end of the first glass tube, and the first glass tube is rotated about its central tube axis. In this condition, the end of the first glass tube 22' is heated using a burner and the diameter is reduced forming a reduced diameter part 22a' at the end of the first glass tube.

(Second Step)

Figure 3B:
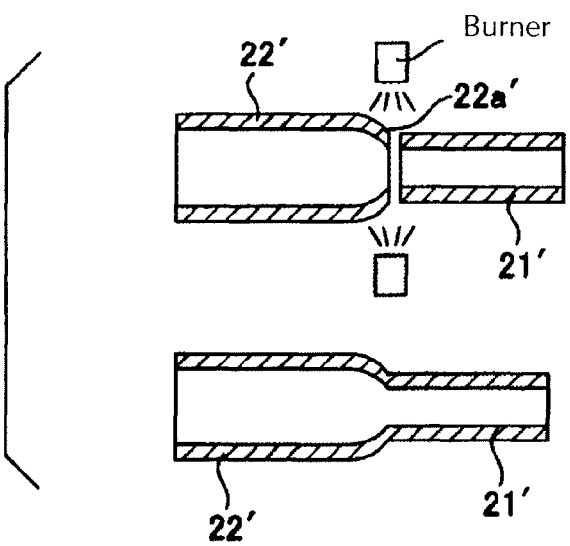

FIG. 3(B) shows a procedure to connect the first glass tube to a second glass tube. The external diameter of the second glass tube 21' is smaller than that of the first glass tube 22'. One end of the straight second glass tube 21' is arranged abutting against the reduced diameter part 22a' of the first glass tube. In this state, the reduced diameter part 22a' of the first glass tube and one end of the second glass tube 21' are heated with a burner and melted.

(Third Step)

Similar to the first step, a third glass tube 22' having the same configuration as the first glass tube is manufactured.

(Fourth Step)

Figure 3C:
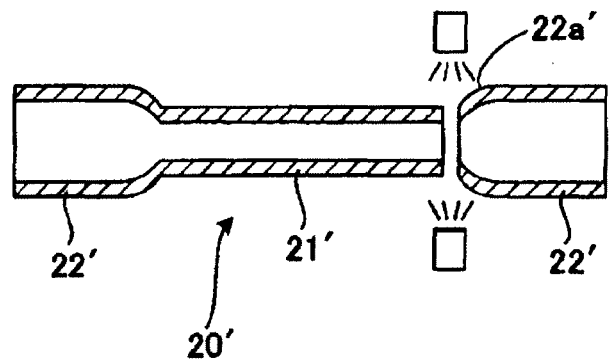

FIG. 3(C) shows a procedure to connect the third glass tube 22' to the other end of the second glass tube 21'. The reduced diameter part 22a' of the third glass tube is arranged abutting against the opening end of the second glass tube 21' at the other end manufactured in the second procedures. In this state, the reduced diameter portion 22a' of the third glass tube and the other end of the second glass tube 21' are heated with a burner and melted.

Thus, the bulb is constructed with a configuration in which the first and third glass tubes 22' are joined to the ends of the second glass tube 21' whose external diameter is smaller than those of the first and third glass tubes.

FIG. 4 shows the procedural steps for manufacturing a hermetically sealed portion where a mount is inserted into the bulb structure, and is hermetically sealed. In FIG. 4, for the convenience of explanation, the anchors 37 are omitted.

(First Step)

Figure 4A:
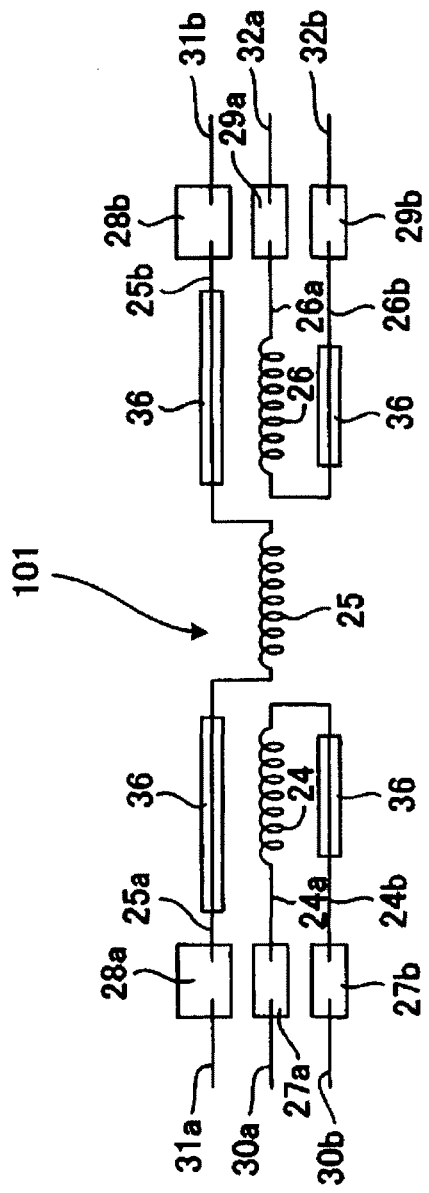
FIGS. 4(A) & 4(B) are diagrams for use in explaining the method for manufacturing a hermetically sealed portion.

FIG. 4(A) shows the configuration of a mount 101. The mount 101 is composed of the filaments 24, 25, 26, the internal leads 24a, 24b, 25a, 25b, 26a, 26b, the metal foils 27a, 27b, 28a, 28b, 29a, 29b, the external leads 30a, 30b, 31a, 31b, 32a, 32b and the insulating tubes 36.

The mount is manufactured as below. The internal leads 24a, 24b, 25a, 25b, 26a, 26b are connected to both ends of the filaments 24, 25 and 26, and the insulating tubes 36 are arranged so as to cover the external circumferences of the internal leads 24b, 25a, 25b and 26b. The ends of the internal leads 24a, 24b, 25a, 25b, 26a, 26b are connected to the metal foils 27a, 27b, 28a, 28b, 29a, 29b, respectively. The ends of the external leads 30a, 30b, 31a, 31b, 32a and 32b are pre-connected to the ends of the metal foils 27a, 27b, 28a, 28b, 29a, 29b, respectively.

(Second Step)

Figure 4B:
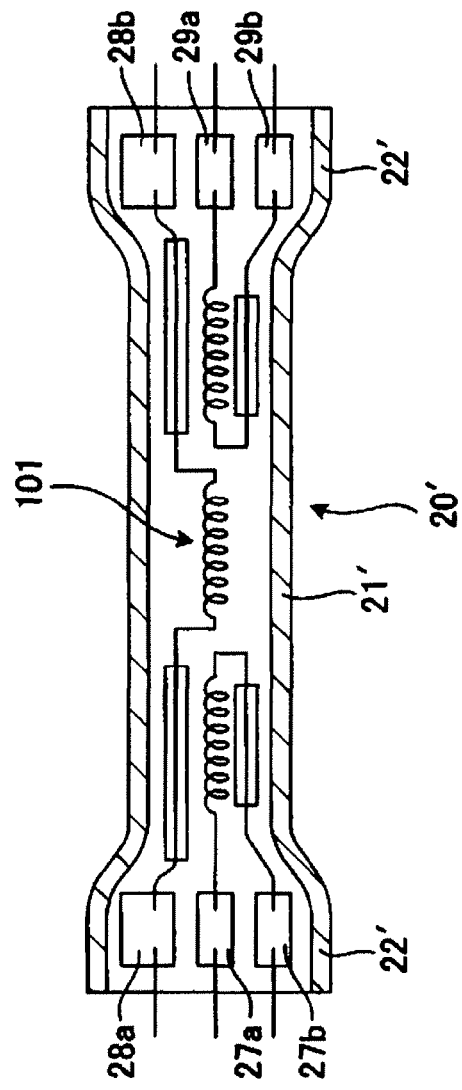

FIG. 4(B) shows a procedure where the mount manufactured with the procedure in FIG. 4(A) is arranged within the bulb structure manufactured with the procedure in FIG. 3 and the hermetically sealed portions are manufactured.

The mount 101 is inserted into the bulb structure 20', such that the metal foils 27b, 27b, 28a are arranged at one end within the glass tube and the metal foils 28b, 29a, 29b are arranged positioned at the other end within the glass tube 22'. Then, the glass tube 22' of the bulb structure 20' is heated to the desired temperature using a flame, and a flat plate-like hermetically sealed portion is hermetically sealed by the socalled pinch seal through using a mold to press together opposite sides of the ends of the glass tube 22', thus hermetically sealing the metal foils.

In the filament lamp of the present invention manufactured as described above, as shown in FIG. 2, the width WK between the outer margins of the metal foils 27b, 28a arranged at both ends of the hermetically sealed portion 22a is a distance between two lines T1, T2 that extend in parallel to the tube axis L of the bulb 20 and measured in a direction at right angles of the tube axis of the bulb, and when the internal diameter of the light emitting tube 21 is D1, the following relationship is satisfied:

WK>D1                              (Relationship 1)

In addition, in the filament lamps of the present invention manufactured as described above, when the width of the hermetically sealed portion 22a in the direction at right angles to the tube axis L of the bulb 20 is WH and the external diameter of the light emitting tube 21 is DO, they are configured so as to satisfy the following relationship 2:

WH>DO                              (Relationship 2)

Although the explanation is omitted, the hermetically sealed portion 22b is configured so as to satisfy both the relationships 1 and 2.

As described above, the filament lamp of the present invention is manufactured using a bulb with a pair of tube parts with a larger diameter for the hermetically sealed portions at both ends of a central tube part with a smaller diameter by connecting a plurality of glass tubes having external diameters that differ from each other.

Thus, even when many and wider metal foils are used, since the larger diameter parts are formed at both ends of the tube, the hermetically sealed portions can be manufactured with many and wider metal foils arranged therein. Therefore, in order to improve the rate of temperature increase of an article to be treated, a large current is supplied to each of the plurality of filaments arranged within the bulb, and, because the individual metal foils are wider, there is no concern about meltdown of the metal foils.

In addition, while the hermetically sealed portions are wider, since the external diameter of the bulb can be the same as before by using a bulb manufactured as described above, a plurality of filaments lamps can be arranged to make close contact with the article to be treated, as will be described below. Therefore, the temperature uniformity of the article W to be treated will not be impaired.

Furthermore, in this filament lamp, the number of filaments is not particularly limited. The number of filaments can be appropriately changed according to the dimension of the article to be treated and physical properties.

<Light Irradiation Type Heat Treatment Device>

Figure 5:
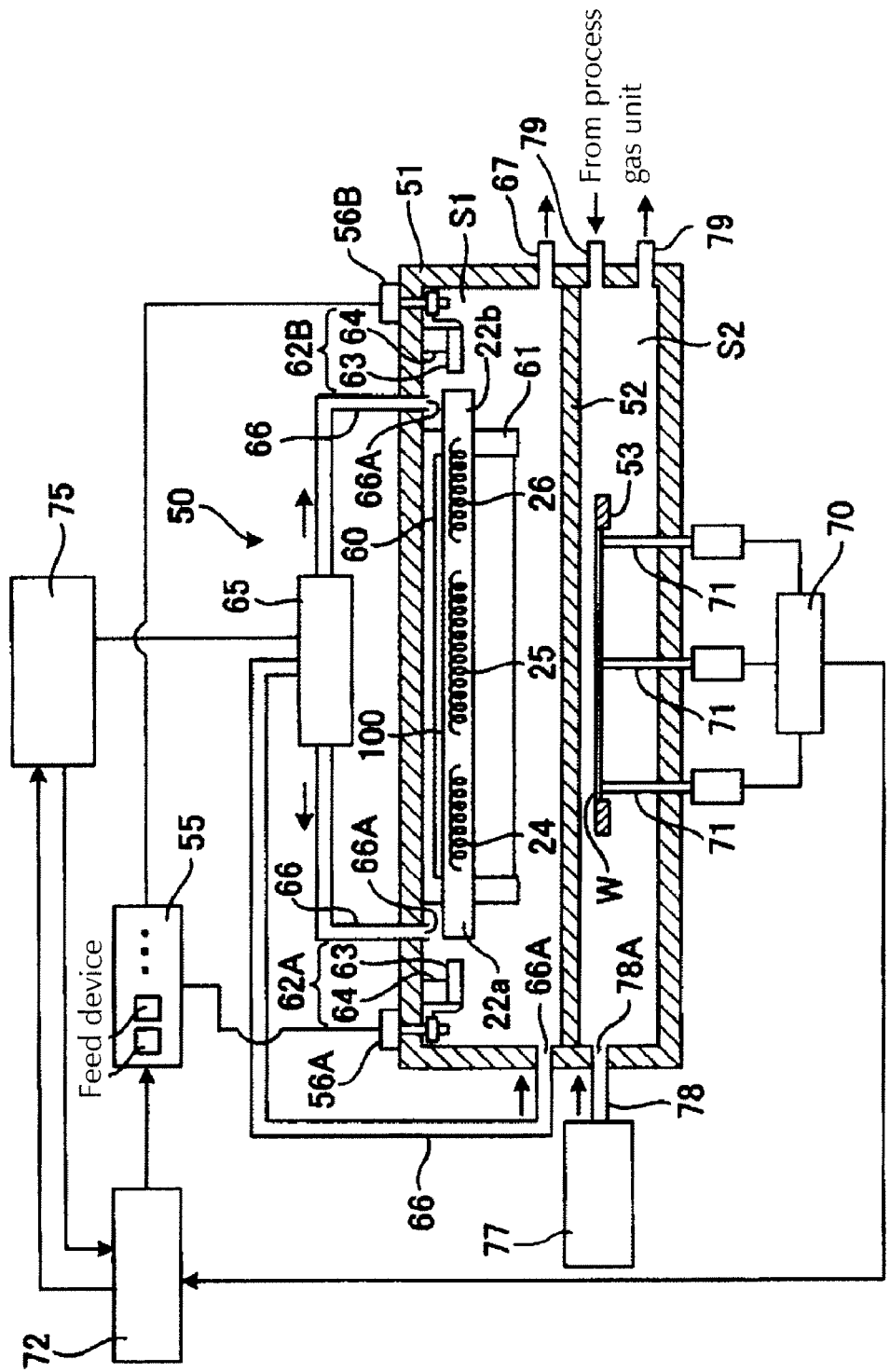
FIG. 5 is a front cross sectional view showing the configuration of the light irradiation type heat treatment device of the present invention.
Figure 6:
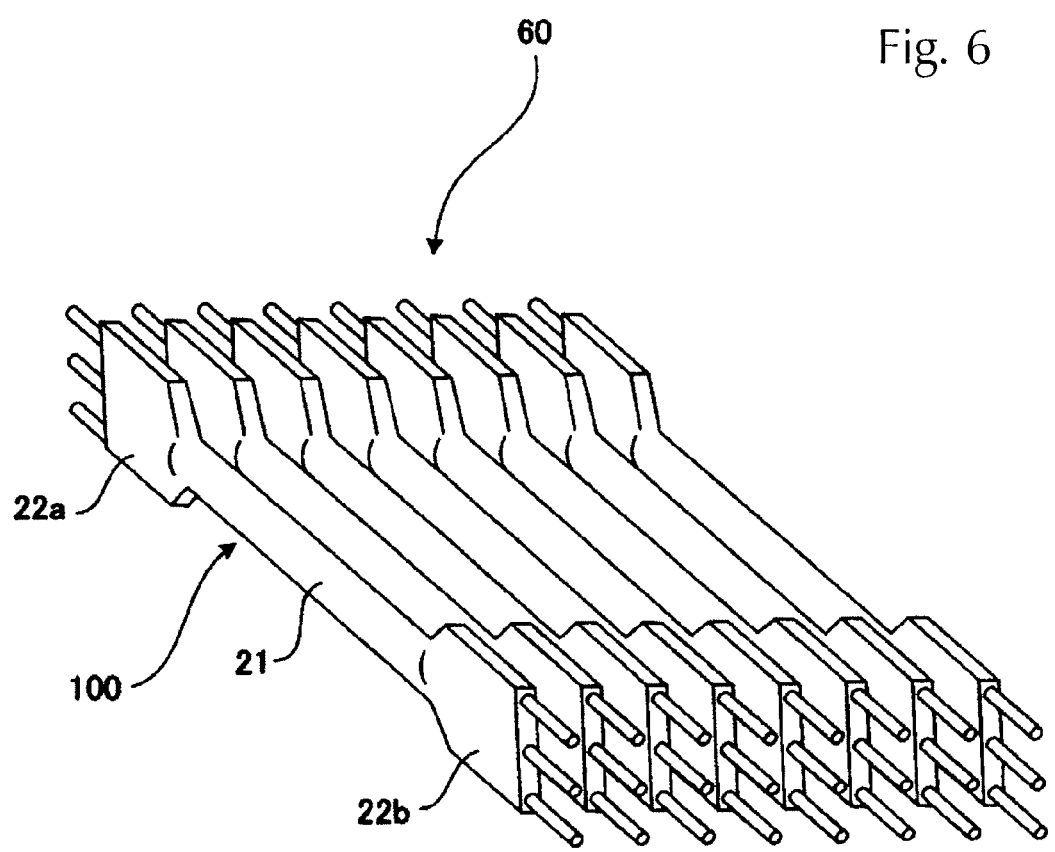
FIG. 6 is a perspective view showing an arrangement example of the filament lamps comprising a lamp unit.
Figure 7:
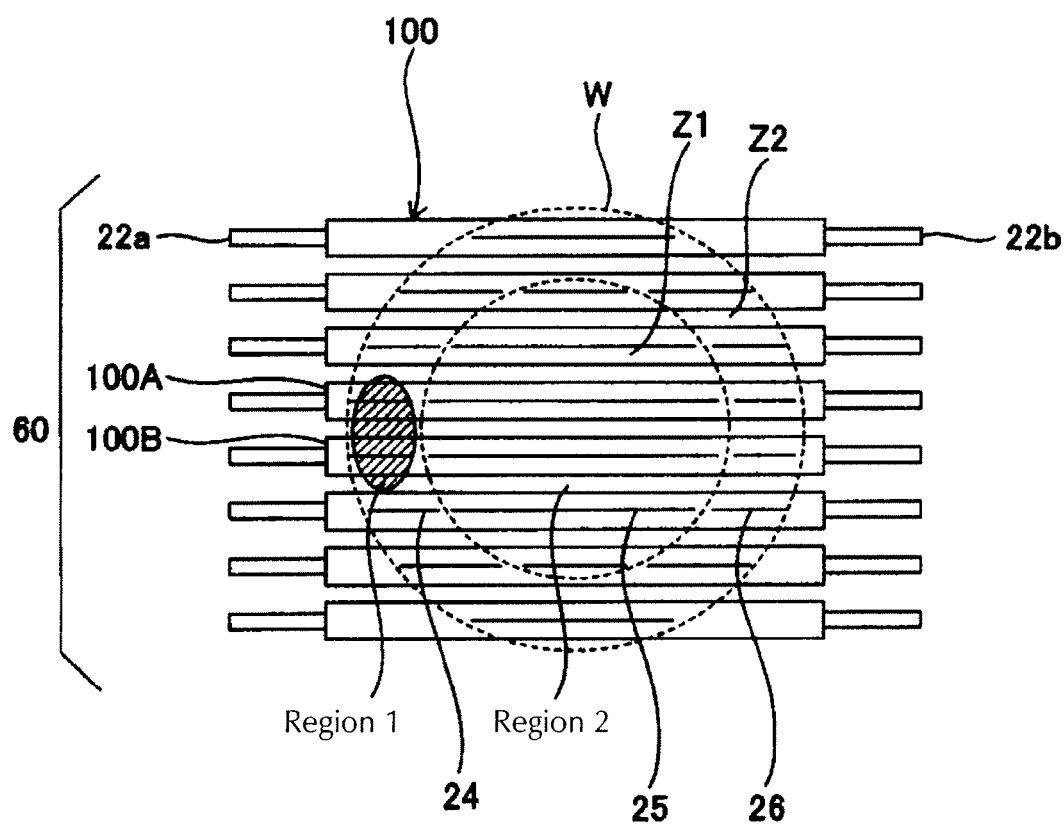
FIG. 7 is a plan view showing an arrangement example of the filament lamps comprising a lamp unit.
Figure 8:
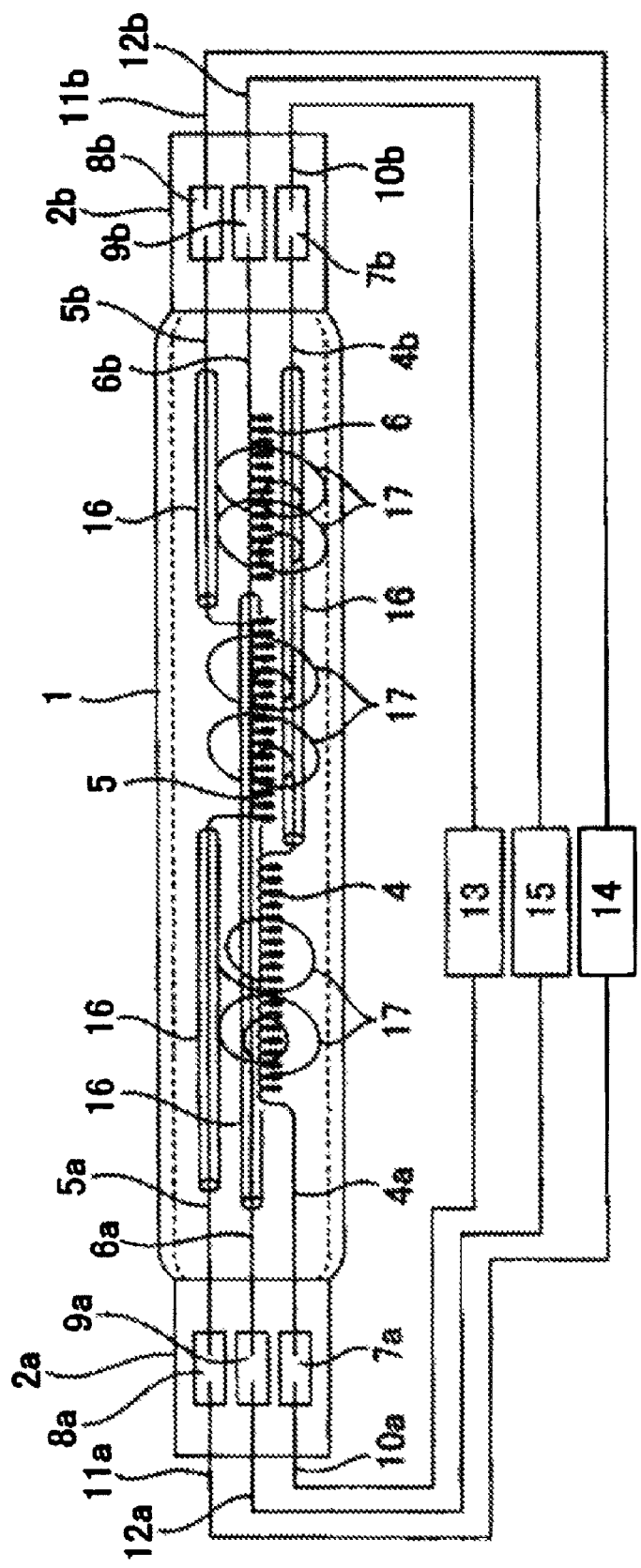
FIG. 8 is a perspective view showing the configuration of the conventional filament lamp.

FIG. 5 is a front cross-sectional view schematically showing the configuration of one example of the light irradiation type heat treatment device of the present invention; FIG. 6 is a perspective view showing an arrangement example of the filament lamps in the lamp unit of the light irradiation type heat treatment device shown in FIG. 5; and FIG. 7 is a plan view showing an example of the arrangement of the filament lamps in the lamp unit of the light irradiation heat treatment device shown in FIG. 5 along with an article to be treated.

This light irradiation type heat treatment device 50 is equipped with a chamber 51 where the internal space is partitioned above and below by a window plate 52 made of, for example, silica, with a lamp unit accommodation space S1 and heat treatment space S2, and the lamp unit 60 composed of a plurality of filament lamps 100 is arranged in the lamp unit accommodation space S1; concurrently, reflecting mirror 61 for reflecting light irradiated upward from the lamp unit 60 is arranged above the lamp unit 60, and this forms the light source.

In the lamp unit 60, as shown in FIG. 6, for example, eight filament lamps 100 are positioned so as to have the lamp center axis in the same plane; concurrently, the hermetically sealed portions 22a, 22b are arranged in parallel at predetermined intervals so as to extend from each other in an almost perpendicular direction with regard to the article W to be treated.

Since the lamp unit 60 is configured as mentioned above, it prevents the hermetically sealed portions 22a, 22b, which are formed to be wider than the external diameter of the light emitting tube 21, from making contact with each other; concurrently, the separation distance between the adjacent light emitting tubes 21 can be reduced as much as possible. Therefore, since many filament lamps can be arranged in parallel relative to the article W to be treated, highly accurate temperature uniformity in the article to be treated can be accomplished.

In the emission region, in the entire lamp unit 60, the number of filaments to be arranged within the light emitting tube 21 is adjusted so as to at least correspond to the length of the region traversed by the filaments 24 to 26 (indicated with solid lines within the filament lamp 100 in FIG. 7), or the number of filaments is unified between each other and the length of one filament is adjusted, or both the number and length of filaments are adjusted and set.

For example, if the article W to be treated is a circular semiconductor wafer, the surface of the semiconductor wafer is divided into a plurality of concentric annular regions Z1, Z2 (the most inner region Z1 is circular) centering on the center of the shape, and desired light irradiance distribution can be obtained by controlling lighting of the filaments 24 to 26 of the filament lamps 100 according to the physical characteristics of the semiconductor wafer.

The reflecting mirror 61 is made of a base material, for example, oxygen free copper, coated with gold, and the reflecting cross section has a shape selected from, for example, a section of a circle, a section of an ellipse, a section of a parabola and a flat plate.

Each filament lamp 100 in the lamp unit 60 is supported by a pair of stationary bases 62A, 62B. The stationary bases 62A, 62B are composed of a conductive member 63 made from a conductive material, and a holding member 64 made from an insulating material, such as ceramics. The holding member 64 is placed on the inner wall of the chamber 61 and supports the conductive member 63.

When the number of filament lamps 100 comprising the lamp unit 60 is n1 and the number of filaments in the filament lamp 100 is m1, if it is configured such that electric power is independently supplied to all filaments, n1×m1 sets of pairs of stationary bases 62A, 62B are required.

A pair of power source supply ports 56A, 56B are connected to a feed wire from the feed device of the power source 55 in the chamber 51, and the number of sets of pairs of power source supply ports 56A, 56B are set according to the number of filament lamps 100 and the number of filaments within the filament lamps 100.

In this embodiment, the power source supply port 56A is electrically connected to the conductive member 63 of the stationary base 62A, and the conductive member 63 of this stationary base 62A is electrically connected to the external lead at one end of a filament in a filament lamp. Further, the power source supply port 56B is electrically connected to the conductive member 63 of the other stationary base 62B, and the conductive member 63 of this stationary base 62B is electrically connected to the external lead at the other end of the filament.

Thus, the filament 24 in one filament lamp 100 comprising the lamp unit 60 is electrically connected to the feed device in the power source part 55. Further, other filaments 25, 26 in this filament lamp 100 are similarly electrically connected to the other pair of feed device power source supply ports, respectively.

Then, each filament in the other filament lamps 100 comprising the lamp unit 60 is similarly electrically connected to the corresponding feed device.

With such a configuration, the irradiance distribution on the article W to be treated can be optionally and accurately set by selectively lighting the filament relating to the filament lamp 100 or by individually adjusting the magnitude of the supply power to each filament. Furthermore, each filament lamp in the lamp unit can be selectively lit and controlled.

In the light irradiation type heat treatment device 50, appropriately controlled power is supplied to each filament of the filament lamps 100 in the lamp unit 60 from the power source unit 55 and they are lit. Like that, the light emitted from each filament lamp 100, which is emitted toward the reflecting mirror 61, is reflected by the reflecting mirror 61, and the reflected light is radiated onto the article W to be treated secured in the heating treatment space S2 via the window plate 52 together with light emitted directly onto it, and heating treatment is performed on the article W to be treated.

In this light irradiation heat treatment device 50, on the occasion of the heat treatment of the article W to be treated, a cooling mechanism for cooling the filament lamp 100 is established. Specifically, cooling air from a cooling air unit 65 located outside of the chamber 51 is introduced into the lamp unit accommodation space S1 via supply openings 66A of cooling air supply nozzles 66 in the chamber 51, and the bulb 20 in each filament lamp 100 is cooled down by blowing the cooling air to each filament lamp 100 in the lamp unit 60, and then, the cooling air, which has become heated to a high temperature due to heat exchange, is discharged to the outside via a cooling air exhaust 67 formed in the chamber 51.

In such cooling mechanism, because each hermetically sealed portion 22 of each filament lamp 100 shows lower heat resistance compared to other sections, it is desirable that the supply openings 66A of the cooling air supply nozzles 66 are formed so as to face the hermetically sealed portions 22 of each filament lamp 100 and the hermetically sealed portions of each filament lamp 100 are cooled with priority.

Furthermore, the flow of the cooling air to be introduced into the lamp unit accommodation space S1 is set so as not to heat the filament lamps 100 with the cooling air which has been heated to a high temperature by heat exchange, and so as to simultaneously cool the reflecting mirror 61. Further, when the reflecting mirror 61 has a configuration for being cooled with water through a water-cooling mechanism (not shown), the flow of the cooling air does not always have to be set to simultaneously cool the reflecting mirror 61.

Further, in the light irradiation type heat treatment device 50, a supply openings 66A of a cooling air supply nozzle 66 is also formed at a position near the window plate 52, and it is configured to cool down the window plate 52 through cooling air from the cooling air unit 65. With this configuration, any occurrence of failures, such as redundancy of the temperature controllability of the article W to be treated by receiving an undesirable heating effect via heat secondarily radiated from the window plate 52, where heat is accumulated by heat radiated from the heated article W to be treated (for example, overshooting, where the temperature of the article to be treated becomes higher than the set temperature), reduction in the temperature uniformity in the article W to be treated due to the temperature variation of the window plate 52 itself where heat is accumulated, or reduction of the temperature reduction rate of the article W to be treated can be securely prevented.

A treatment base 53, where the article W to be treated is located in the heat treatment space S2, is located in the chamber 51. The treatment base 53 is preferably made from a high-melting point metal material, such as molybdenum, tungsten or tantalum, a ceramic material, such as silicon carbide (SiC), or a thin plate circular body made of silica or silicon (Si) with a guard ring structure with a shoulder around the inner circumference of the circular opening for supporting the semiconductor wafer.

Since the treatment base 53 will reach a high temperature by light irradiation, the outer circumference of the facing semiconductor wafer is supplementarily irradiated and heated, and a temperature decrease at the outer edge of the semiconductor wafer due to heat radiation from the outer circumference of the semiconductor is compensated.

A plurality of temperature measuring parts 71 formed with, for example, a thermocouple or a radiation thermometer, for monitoring the temperature distribution of the article W to be treated are located on the rear surface of the article W to be treated placed in the treatment base 53 so as to come into contact with or come close to the article W to be treated, and each temperature measuring part 71 is connected to a thermometer 70. Herein, the number and arrangement position of the temperature measuring parts 71 are not particularly limited, and can be set according to the dimensions of the article W to be treated.

The thermometer 70 functions to calculate the temperature at the measuring point of each temperature measuring part 71 based upon the temperature information monitored by each temperature measuring part 71. Concurrently, thermometer 70 also functions to send the calculated temperature information to a main control part 75 via the temperature control part 72.

The main control part 75 functions to send an instruction when the temperature on the article W to be treated reaches a uniform distribution state at a predetermined temperature based upon the temperature information at each measuring point on the article W to be treated. The temperature control part 72 functions to control the magnitude of the power supplied to the filaments of each filament lamp 100 from the power source part 55 based upon the instruction from the main control part 75.

When obtaining temperature information from the temperature control part 72, for example, that the temperature at one measuring point is lower than the predetermined temperature, the main control part 75 sends an instruction to increase the power being supplied to the filaments in order to increase the light emitted from the filaments that irradiate that measuring point, and the temperature control part 72 increases the power to be supplied to the power source supply ports 56A, 56B connected to the filaments from the power source 55.

Further, the main control part 75 sends an instruction to the cooling air unit 65 at the time of lighting the filament lamp 100 in the lamp unit 60, and the cooling air unit 65 supplies cooling air so as not to cause the bulb 20, the reflecting mirror 61 and the window plate 52 to be heated to a high temperature because of said instruction.

In addition, in this light irradiation type heat treatment device 50, a process gas unit 77 is connected that introduces process gas into and discharges process gas from the heat treatment space S2 according to the type of heat treatment to be performed. For example, in the case of a thermal oxidation process, the process gas unit 77 introduces and discharges oxygen gas and purge gas (for example, nitrogen gas) for purging the heat treatment space S2 is connected to the heat treatment space S2. Process gas and purge gas from the process gas unit 77 are introduced into the heat treatment space S2 via the supply opening 78A of the gas supply nozzle 78 established in the chamber 61; and are discharged to the outside via the exhaust 79.

According to this light irradiation type heat treatment device 50, basically, the following effects are reached.

Since, in the lamp unit 60, a plurality of filaments are sequentially aligned and arranged so as to extend in the tube axis direction within the bulb 20, and because a plurality of filament lamps 100 having independently fed filaments are arranged, the light intensity distribution can be adjusted in both the tube axis direction of the bulb and its vertical direction, and the irradiance distribution on the surface of the article W to be treated can be accurately set with regard to the two-dimensional direction. For example, it is possible to limit the irradiance only to a specific small region whose entire length is shorter than the emission length of the filament lamp 100, since the irradiance on this specific region can be set and the irradiance distribution corresponding to any respective characteristic can be set independently on this specific region and other regions.

For example, in the article W to be treated shown in FIG. 7, a case is assumed where the temperature in the region immediately below the filament lamp 100A and the filament lamp 100B (also referred to as region 1) within the toric region Z2 is lower than the temperature in other areas (also referred to as region 2) in the article W to be treated, or a case when it has already been ascertained that the degree of temperature increase in the region 1 is smaller than that in the region 2. In this case, among the filaments in the filament lamp 100A and the filament lamp 100B, an increase in the feeding amount of current to the filaments corresponding to the region 1 enables a temperature adjustment so that the temperature in the region 1 and the region 2 become uniform. Therefore, the heat treatment can be applied to throughout the entire article W to be treated with a uniform temperature distribution.

The irradiance distribution on the article W to be treated, arranged at predetermined distance from the lamp unit 60, can be accurately set in any distribution, and as a result, it also becomes possible that the irradiance distribution on the article W to be treated is asymmetrically set with regard to the shape of the article W to be treated. Therefore, even when the distribution of the degree of local temperature change in the article W to be treated is asymmetrical, the irradiance distribution on the article W to be treated can be set corresponding to this, and the article W to be treated can be heated in a uniform temperature distribution state.

In addition, since the filament lamp 100 is configured such that the distance between the filaments 24 to 26 within the bulb 20 can be extremely small, it is possible to extremely reduce undesirable variations in the irradiance distribution on the article W to be treated.

Further, the article to be treated in the light irradiation type heat treatment device of the present invention is not limited to a semiconductor wafer, but for example, a polycrystalline silicon substrate for a solar cell panel, a glass substrate, a ceramics substrate and a glass substrate for a liquid crystal display element (LCD) can be exemplified.

In particular, a quadrilateral substrate is often used for a multi-material substrate for a solar cell panel, and many of the light irradiation type heat treatment devices used for the heat treatment of such an article to be treated are configured such that, while the quadrilateral substrate is horizontally moved, band-like light is emitted and heat treatment is applied by a single filament lamp arranged so that the tube axis extends in the direction at right angles of the substrate movement direction, or by a plurality of filament lamps arranged in parallel so as to have each tube axis stretching in the direction at right angles of the substrate movement direction. In such a case, the temperature decrease of the two sides (both band-like sides) parallel to the substrate movement direction is compensated for by using the filament lamp(s) relating to the present invention where three or more filaments are arranged and the irradiance distribution of the center of substrate (band-like center part) can be adjusted; therefore, highly accurate temperature control can be securely provided.

What is claimed is:

1. A filament lamp, comprising:
a bulb comprised of a straight light emitting tube and a pair of flat hermetically sealed portions continuously formed at each of opposite ends of the light emitting tube,
a plurality of coiled filaments sequentially aligned and arranged in a tube axis direction within the light emitting tube,
a pair of internal leads, each of which is connected to a respective one of the ends of the filament,
a plurality of metal foils spaced from each other, embedded in the hermetically sealed portions, and connected to the internal leads, and
external leads connected to the metal foils,
wherein the hermetically sealed portions are wider than the external diameter of the light emitting tube; and
wherein the width, in a direction at right angles of the tube axis and defined between two parallel lines extending in the tube axis direction, between outer margins of two of the metal foils arranged at opposite ends of each hermetically sealed portion in the direction at right angles of the tube axis is greater than the internal diameter of the light emitting tube.

2. Light irradiation type heat treatment device having a lamp unit with a plurality of filament lamps, each of the filament lamps comprising:
a bulb comprised of a straight light emitting tube and a pair of flat hermetically sealed portions, each of which is continuously formed at a respective one of opposite ends of the light emitting tube and having a width that is greater than the external diameter of the light emitting tube,
a plurality of coiled filaments sequentially aligned and arranged in a tube axis direction within the light emitting tube,
a pair of internal leads, each of which is connected to a respective one of the ends of the filament,
a plurality of metal foils spaced from each other, embedded in the hermetically sealed portions, and connected to the internal leads, and
external leads connected to the metal foils,
wherein the width, in a direction at right angles of the tube axis and defined between two parallel lines extending in the tube axis direction, between outer margins of two of the metal foils arranged at opposite ends of each hermetically sealed portion in the direction at right angles of the tube axis is greater than the internal diameter of the light emitting tube, and
wherein the flat hermetically sealed portions are arranged extending in parallel in the vertical direction to an article to be treated.

* * * * *